(12) United States Patent
Han et al.

(10) Patent No.: US 10,403,848 B2
(45) Date of Patent: Sep. 3, 2019

(54) FLEXIBLE DISPLAY PANEL

(71) Applicant: WUHAN CHINA STAR OPTOELECTRONICS TECHNOLOGY CO., LTD., Wuhan (CN)

(72) Inventors: Wen Han, Wuhan (CN); Rong Ma, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 40 days.

(21) Appl. No.: 15/547,500

(22) PCT Filed: Apr. 18, 2017

(86) PCT No.: PCT/CN2017/080946
§ 371 (c)(1),
(2) Date: Jul. 30, 2017

(87) PCT Pub. No.: WO2018/166032
PCT Pub. Date: Sep. 20, 2018

(65) Prior Publication Data
US 2018/0277790 A1    Sep. 27, 2018

(30) Foreign Application Priority Data
Mar. 17, 2017 (CN) .......................... 2017 1 0159788

(51) Int. Cl.
*H05K 5/00* (2006.01)
*H01L 51/52* (2006.01)
(Continued)

(52) U.S. Cl.
CPC ........ *H01L 51/5237* (2013.01); *G06F 1/1652* (2013.01); *H01L 51/0097* (2013.01);
(Continued)

(58) Field of Classification Search
USPC .......................................... 361/755
See application file for complete search history.

(56) References Cited

U.S. PATENT DOCUMENTS 8,755,180 B2 * 6/2014 Yeh ........................ G06F 1/1679
  361/679.01
9,996,108 B2 * 6/2018 Morrison .............. G06F 1/1616
(Continued)

FOREIGN PATENT DOCUMENTS

CN      200920243050    *  6/2009    ............. F16B 47/00
CN         104751739 A      7/2015
(Continued)

*Primary Examiner* — Hung S. Bui
(74) *Attorney, Agent, or Firm* — JMB Davis Ben-David

(57) ABSTRACT

A flexible display panel is disclosed. The flexible display panel includes a flexible display unit and a curved state setting component. The flexible display unit includes a first surface and a second surface opposite the first surface where the first surface is an emitting surface of the flexible display unit. The curved state setting component is fixed on the second surface to adjust the flexible display unit in a curved state. This disclosure allows the flexible display panel to remain in a curved state.

20 Claims, 2 Drawing Sheets

(51) Int. Cl.
  *H01L 51/00* (2006.01)
  *H05K 5/02* (2006.01)
  *G06F 1/16* (2006.01)

(52) U.S. Cl.
  CPC ......... *H05K 5/0017* (2013.01); *H05K 5/0217* (2013.01); *H01L 2251/5338* (2013.01)

(56) References Cited

U.S. PATENT DOCUMENTS

| | | | |
|---|---|---|---|
| 2010/0263245 A1* | 10/2010 | Bowser | G09F 11/21 40/517 |
| 2010/0265668 A1* | 10/2010 | Yuen | G09F 7/04 361/736 |
| 2011/0026203 A1* | 2/2011 | Ligtenberg | E05C 19/16 361/679.01 |
| 2016/0048169 A1 | 2/2016 | Yang et al. | |
| 2016/0278222 A1 | 9/2016 | Lee | |
| 2017/0060183 A1* | 3/2017 | Zhang | G06F 1/1605 |
| 2017/0205853 A1 | 7/2017 | Sun | |
| 2017/0332497 A1 | 11/2017 | Zhang | |

FOREIGN PATENT DOCUMENTS

| | | |
|---|---|---|
| CN | 104916230 A | 9/2015 |
| CN | 205621366 U | 10/2016 |
| CN | 106205383 A | 12/2016 |

* cited by examiner

FLEXIBLE DISPLAY PANEL

CROSS-REFERENCE TO RELATED APPLICATIONS

This is the U.S. National Stage of International Patent Application No. PCT/CN2017/080946, filed Apr. 18, 2017, which in turn claims the benefit of Chinese Patent Application No. 201710159788.4, filed Mar. 17, 2017.

FIELD OF THE INVENTION

The present disclosure relates to the field of display technology, and more particularly to a flexible display panel.

BACKGROUND OF THE INVENTION

Conventional flexible display panels can be curved by users and display while curved. The above-mentioned conventional flexible display panels are in a plane state in normal situations, and will change from the plane state to a curved state when encountering an external force.

However, the above-mentioned conventional flexible display panels will change from a curved state to a plane state and be unable to maintain a curved state when the external force disappears.

Thus, to solve the above-mentioned technical problems, a new technical solution is required.

SUMMARY OF THE INVENTION

The object of this disclosure is to provide a flexible display panel allowing the flexible display panel to remain in a curved state.

To solve the above-mentioned problems, the present disclosure proposes a flexible display panel including a flexible display unit and a curved state setting component. The flexible display unit includes a first surface and a second surface opposite the first surface. The first surface is an emitting surface of the flexible display unit. The curved state setting component is fixed on the second surface to adjust the flexible display unit in a curved state. The curved state setting component includes one or more first fitting parts and one or more second fitting parts, where both the one or more first fitting parts and the one or more second fitting parts fix on the second surface. Upon a condition that the curved state setting component includes two or more the first setting parts and two or more the second setting parts, the two or more first setting parts and the two or more second setting parts are arranged in a one-dimensional array or a two-dimensional array.

In the flexible display panel, when the first fitting parts connect to the second fitting parts, the flexible display panel changes from a plane state to a curved state.

In the flexible display panel, when the first fitting part separates from the second fitting part, the flexible display panel changes from the curved state into a plane state.

In the flexible display panel, the curved state setting component is a hook-and-loop fastener.

In the flexible display panel, the first fitting parts and the second fitting parts are the hooks and the loops respectively of the hook-and-loop fasteners.

A flexible display panel includes a flexible display unit and a curved state setting component. The flexible display unit includes a first surface and a second surface opposite to the first surface. The first surface is an emitting surface of the flexible display unit. The curved state setting component fixes on the second surface to adjust the flexible display unit to a curved state.

In the flexible display panel, the curved state setting component includes one or more first fitting parts and one or more second fitting parts, where both the one or more first fitting parts and one or more second fitting parts fix on the second surface.

In the flexible display panel, when the first fitting parts connect to the second fitting parts, the flexible display panel changes from a plane state to a curved state.

In the flexible display panel, when the first fitting part separates from the second fitting part, the flexible display panel changes from the curved state into a plane state.

In the flexible display panel, the curved state setting component is a hook-and-loop fastener.

In the flexible display panel, the first fitting parts and the second fitting parts are the hooks and the loops respectively of the hook-and-loop fasteners.

In the flexible display panel, the curved state setting component is magnet pads.

In the flexible display panel, the first fitting parts and the second fitting parts are the first magnet block and an iron block respectively of the magnet pads.

In the flexible display panel, the first fitting parts and the second fitting parts are the second magnet block and the third magnet block respectively of the magnet pads.

In the flexible display panel, upon a condition that the curved state setting component includes two or more of the first setting parts and two or more of the second setting parts, the two or more first setting parts and the two or more second setting parts are arranged in a one-dimensional array or a two-dimensional array.

In the flexible display panel, the flexible display panel further includes a fixing component to fix the curved state setting component on the second surface.

In the flexible display panel, the fixing component includes a holding part mating with the second surface and a clip part disposed on the holding part to mate with the curved state setting component.

In the flexible display panel, the holding part includes teeth fitting an edge of the curved state setting component in order to fix the curved state setting component.

In the flexible display panel, the teeth being located on the holding part correspond to the edge of the curved state setting component.

In the flexible display panel, the holding part further includes a pad sucker, disposed on the side contacting with the flexible display unit, to suck the holding part onto the flexible display unit.

The flexible display panel has a curved state setting component located opposite the light emitting surface; therefore the curved state setting component can allow the flexible display panel to remain in the curved state in contrast with existing technology. In other words, this present disclosure can allow the flexible display panel to remain in the curved state.

The embodiment will be described below accompanied with drawings to make the above-mentioned context of this disclosure understood more easily.

DETAILED DESCRIPTION OF THE PREFERRED EMBODIMENTS

The term "embodiments" used in this specification means examples. Furthermore, the article "a", used in this specification and claims could be explained as "one or more" unless it can be identified clearly as single from the context.

The flexible display panel of this disclosure could be, for example, an OLED (Organic Light Emitting Diode) panel, etc.

Figure 1:
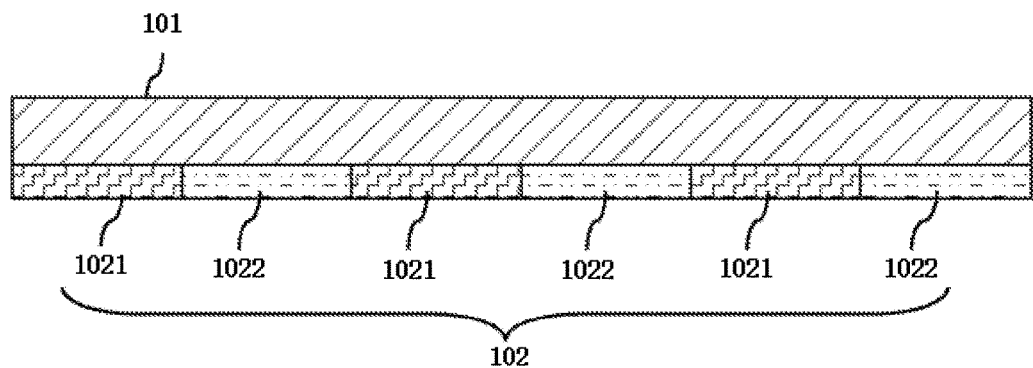
FIG. 1 illustrates a flexible display panel in a plane state according to an embodiment of the present disclosure.
Figure 2:
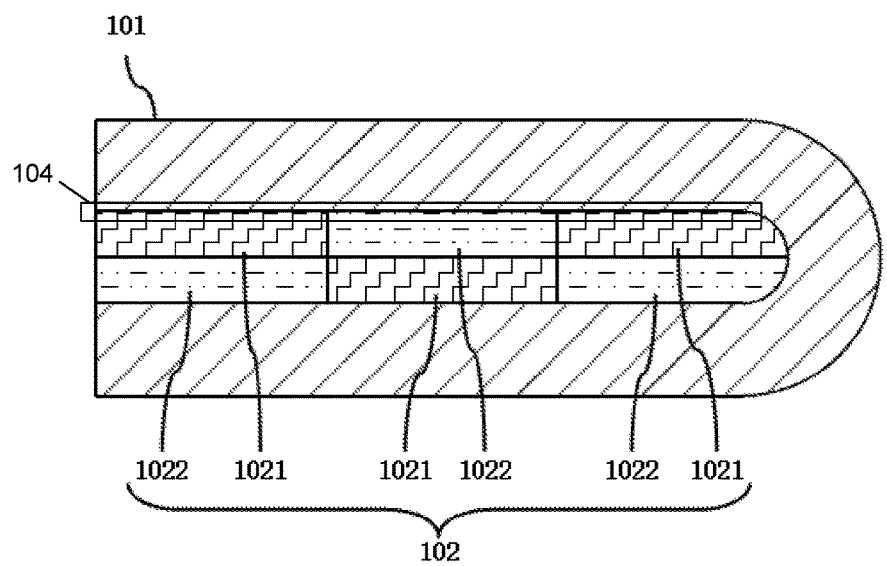
FIG. 2 illustrates the flexible display panel in a curved state according to an embodiment of the present disclosure.
Figure 3:
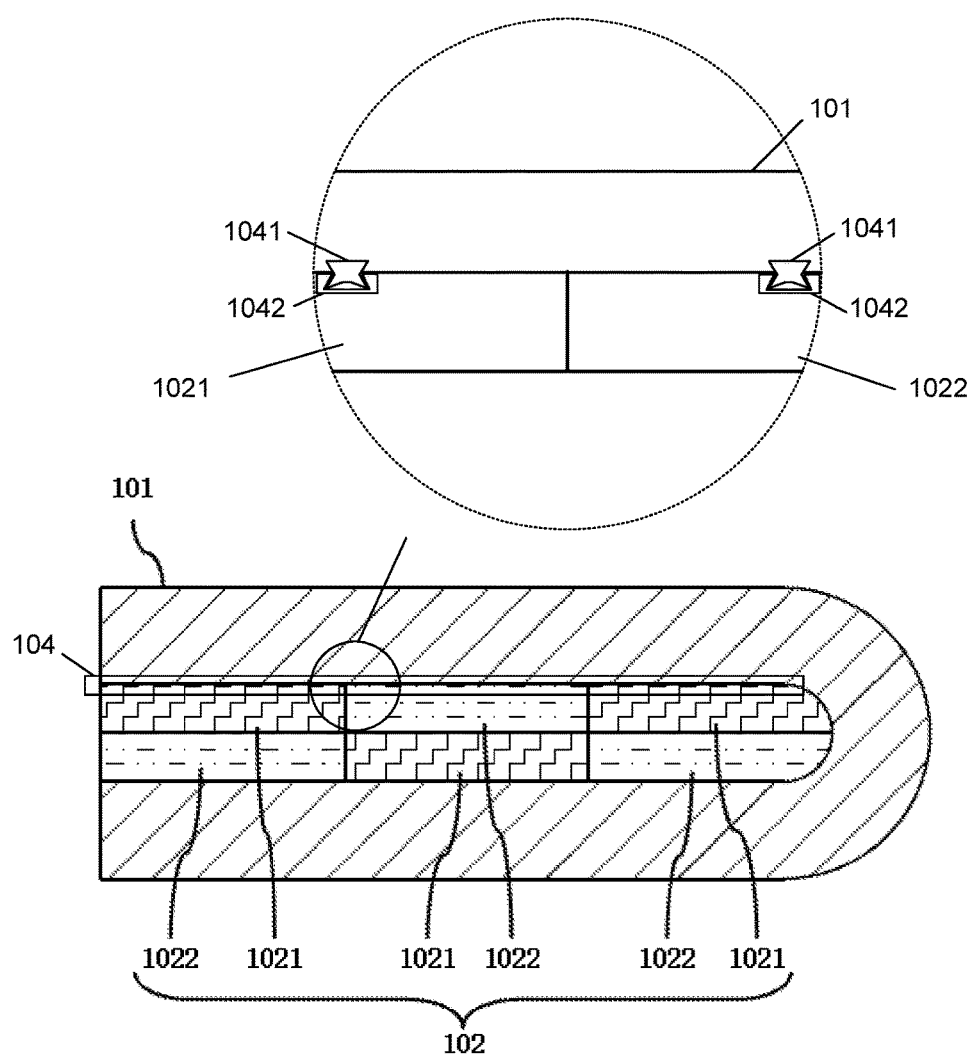
FIG. 3 illustrates a fixing component of the flexible display panel in the curved state of the embodiment of the present disclosure.

Referring to FIG. 1 and FIG. 2, FIG. 1 illustrates a flexible display panel in a plane state according to an embodiment of the present disclosure. FIG. 2 illustrates the flexible display panel in a curved state according to an embodiment of the present disclosure.

The flexible display panel of this disclosure includes a flexible display unit 101 and a curved state setting component 102.

The flexible display unit 101 includes a first surface and a second surface. The first surface is an emitting surface of the flexible display unit 101, and the first surface is opposite the second surface.

The curved state setting component 102 is fixed on the second surface to adjust the flexible display unit to be in a curved state.

In the flexible display panel of this disclosure, the curved state setting component 102 includes first fitting parts 1021 and second fitting parts 1022.

The first fitting parts 1021 and the second fitting parts 1022 are both fixed on the second surface.

In the flexible display panel of this disclosure, the first fitting parts 1021 connect to the second fitting parts 1022 to make the flexible display panel change from the plane state into a curved state and remain in the curved state.

In the flexible display panel of this disclosure, when the first fitting parts 1021 separate from the second fitting parts 1022, the flexible display panel changes from the curved state into a plane state.

In the flexible display panel of this disclosure, the curved state setting component 102 is a hook-and-loop fastener.

In the flexible display panel of this disclosure, the first fitting parts 1021 and the second fitting parts 1022 are the hooks and the loops correspondingly of the hook-and-loop fasteners.

In the flexible display panel of this disclosure, the curved state setting component 102 is a magnet pad.

In the flexible display panel of this disclosure, the first fitting parts 1021 and the second fitting parts 1022 are a first magnet block and an iron block of the magnet pads.

In the flexible display panel of this disclosure, the first fitting parts 1021 and the second fitting parts 1022 are a second magnet block and the third magnet block of the magnet pads.

In the flexible display panel of this disclosure, upon a condition that the curved state setting component 102 includes two or more the first setting parts 1021 and two or more the second setting parts 1022, the two or more first setting parts 1021 and the two or more second setting parts 1022 are arranged in a one-dimensional array or a two-dimensional array As an improvement, the flexible display panel further includes a fixing component 104 to fix the curved state setting component 102 on the second surface.

The fixing component includes a holding part 1041 mating with the second surface and a clip part 1042 disposed on the holding part 1041 to mate with the curved state setting component.

The holding part 1041 includes teeth fitting an edge of the curved state setting component in order to fix the curved state setting component.

The teeth are located on the holding part corresponding to the edge of the curved state setting component.

The holding part further includes a pad sucker, disposed on the side contacting with the flexible display unit 101, to suck the holding part onto the flexible display unit 101.

Upon the above-mentioned technology solution, there is a curved state setting component located on the surface opposite the light emitting surface of the flexible display unit 101. The curved state setting component can allow the flexible display unit 101 to set and remain in the curved state. That is, this disclosure can make the flexible display panel remain in the curved state.

In conclusion, although this disclosure has been disclosed through the superior embodiments above, the superior embodiments above are not utilized to limit this invention. The one having ordinary skills can change and modify without disobeying the concepts and scope of this disclosure. Therefore, the scope that this disclosure protects is based on the scope defined by the claims.

What is claimed is:

1. A flexible display panel comprising:
    a flexible display unit comprising a first surface and a second surface opposite to the first surface, the first surface being an emitting surface of the flexible display unit;
    a curved state setting component, fixed on the second surface, to adjust the flexible display unit in a curved state;
    the curved state setting component comprising:
    one or more first fitting parts;
    one or more second fitting parts;
    where both the one or more first fitting parts and second fitting parts fix on the second surface;
    wherein upon a condition that the curved state setting component comprises two or more of the first setting parts and two or more of the second setting parts, the two or more first setting parts and the two or more second setting parts are arranged in a one-dimensional array or a two-dimensional array.

2. The flexible display panel of claim 1, wherein when the first fitting parts connect to the second fitting parts, the flexible display panel changes from a plane state to the curved state.

3. The flexible display panel of claim 1, wherein when the first fitting part separates from the second fitting part, the flexible display panel changes from the curved state into a plane state.

4. The flexible display panel of claim 1, wherein the curved state setting component is a hook-and-loop fastener.

5. The flexible display panel of claim 4, wherein the first fitting parts and the second fitting parts are the hooks and the loops respectively of the hook-and-loop fasteners.

6. A flexible display panel comprising:
    a flexible display unit comprising a first surface and a second surface opposite the first surface, the first surface being an emitting surface of the flexible display unit; and
    a curved state setting component, fixed on the second surface, to adjust the flexible display unit in a curved state.

7. The flexible display panel of claim 6, wherein the curved state setting component comprising:
one or more first fitting parts; and
one or more second fitting parts;
where both the one or more first fitting parts and second fitting parts fix on the second surface.

8. The flexible display panel of claim 7, wherein when the first fitting parts connect to the second fitting parts, the flexible display panel changes from a plane state to the curved state.

9. The flexible display panel of claim 7, wherein when the first fitting part separates from the second fitting part, the flexible display panel changes from the curved state into a plane state.

10. The flexible display panel of claim 7, wherein the curved state setting component is a hook-and-loop fastener.

11. The flexible display panel of claim 10, wherein the first fitting parts and the second fitting parts are the hooks and the loops respectively of the hook-and-loop fasteners.

12. The flexible display panel of claim 7, wherein the curved state setting component is magnet pads.

13. The flexible display panel of claim 12, wherein the first fitting parts and the second fitting parts are the first magnet block and an iron block respectively of the magnet pads.

14. The flexible display panel of claim 12, wherein the first fitting parts and the second fitting parts are the second magnet block and the third magnet block respectively of the magnet pads.

15. The flexible display panel of claim 7, wherein upon a condition that the curved state setting component comprises two or more the first setting parts and two or more the second setting parts, the two or more first setting parts and the two or more second setting parts are arranged in a one-dimensional array or a two-dimensional array.

16. The flexible display panel of claim 6, further comprising a fixing component to fix the curved state setting component on the second surface.

17. The flexible display panel of claim 16, wherein the fixing component comprises a holding part mating with the second surface and a clip part disposed on the holding part to mate with the curved state setting component.

18. The flexible display panel of claim 17, wherein the holding part comprises teeth fitting an edge of the curved state setting component in order to fix the curved state setting component.

19. The flexible display panel of claim 18, wherein the teeth are located on the holding part corresponding to the edge of the curved state setting component.

20. The flexible display unit panel of claim 17, wherein the holding part further comprises a pad sucker, disposed on the side contacting with the flexible display unit, to suck the holding part onto the flexible display unit.

* * * * *